United States Patent
Ho

(12) 
(10) Patent No.: US 6,387,859 B1
(45) Date of Patent: May 14, 2002

(54) METHOD AND CLEANER COMPOSITION FOR STRIPPING COPPER CONTAINING RESIDUE LAYERS

(75) Inventor: Kwok Keung Paul Ho, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/670,327

(22) Filed: Sep. 27, 2000

Related U.S. Application Data

(62) Division of application No. 09/467,135, filed on Dec. 20, 1999, now Pat. No. 6,123,088.

(51) Int. Cl.[7] .................................................. C11D 1/00
(52) U.S. Cl. ...................... 510/175; 510/176; 510/499; 510/500; 510/255; 510/257; 510/264; 510/265
(58) Field of Search .............................. 510/166, 169, 510/170, 171, 175, 176, 499, 500, 264, 265, 255, 257; 134/1.3, 2

(56) References Cited

U.S. PATENT DOCUMENTS

| | | | |
|---|---|---|---|
| 5,281,304 A | | 1/1994 | Kadomura .................. 156/656 |
| 5,316,573 A | | 5/1994 | Brusic et al. ............. 106/14.16 |
| 5,709,756 A | * | 1/1998 | Ward et al. |
| 5,770,095 A | | 6/1998 | Sasaki et al. .................. 216/38 |
| 5,792,274 A | * | 8/1998 | Tanabe et al. ................ 134/1.3 |
| 5,865,900 A | | 2/1999 | Lee et al. ...................... 134/12 |
| 5,882,425 A | | 3/1999 | Graham ....................... 134/1.3 |
| 5,897,379 A | | 4/1999 | Ulrich et al. ................ 438/754 |
| 5,905,063 A | * | 5/1999 | Tanabe et al. .............. 510/176 |
| 5,911,836 A | * | 6/1999 | Hada et al. ..................... 134/2 |
| 5,968,848 A | * | 10/1999 | Tanabe et al. .............. 438/745 |
| 6,068,000 A | * | 5/2000 | Tanabe et al. ................ 134/1.3 |

OTHER PUBLICATIONS

Ng et al., "Synthesis of Some Carbonyl Derivatives of BTA and Determination of Their Inhibitive Properties for Copper in 3% NaCl Solution", Corrosion Science and Protection Technology, vol. 9(3), Jul. 1997, pp. 201–204.

* cited by examiner

*Primary Examiner*—Gregory Delcotto
(74) *Attorney, Agent, or Firm*—George O. Saile; Rosemary L. S. Pike; Stephen G. Stanton

(57) ABSTRACT

A cleaner composition for removing from within a microelectronic fabrication a copper containing residue layer in the presence of a copper containing conductor layer, and a method for stripping from within a microelectronic fabrication the copper containing residue layer in the presence of the copper containing conductor layer. The cleaner composition comprises: (1) a hydroxyl amine material; (2) an ammonium fluoride material; and (3) a benzotriazole (BTA) material. The cleaner composition contemplates the method for stripping from within the microelectronic fabrication the copper containing residue layer in the presence of the copper containing conductor layer.

24 Claims, 3 Drawing Sheets

METHOD AND CLEANER COMPOSITION FOR STRIPPING COPPER CONTAINING RESIDUE LAYERS

This is a division of patent application Ser. No. 09/467,135, filing date Dec. 20, 1999, now U.S. Pat. No. 6,123,088, Method And Cleaner Composiiton For Stripping Copper Containing Residue Layers, assigned to the same assignee as the present invention.

BACKGROUND OF THE INVENTION

1. Field of the Invention

The present invention relates generally to methods and cleaner compositions for forming residue free layers within microelectronic fabrications. More particularly, the present invention relates to methods and cleaner compositions for forming copper containing residue layer free microelectronic layers in the presence of copper containing conductor layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common within the art of microelectronic fabrication to employ when forming patterned microelectronic conductor layers within microelectronic fabrications, such as but not limited to patterned microelectronic conductor contact layers and patterned microelectronic conductor interconnect layers within microelectronic fabrications, copper containing conductor materials.

Copper containing conductor materials are desirable when forming patterned microelectronic conductor layers within microelectronic fabrications since copper containing conductor materials typically possess enhanced electrical properties in comparison with other conductor materials, such as but not limited to aluminum containing conductor materials and tungsten containing conductor materials, which may alternatively be employed for forming patterned microelectronic conductor layers within microelectronic fabrications.

While copper containing conductor materials are thus desirable in the art of microelectronic fabrication for forming patterned microelectronic conductor layers within microelectronic fabrications, copper containing conductor materials are not without problems within the art of microelectronic fabrication for forming patterned microelectronic conductor layers within microelectronic fabrications. In that regard, insofar as copper containing conductor materials are often difficult to pattern while employing reactive ion etch (RIE) plasma etch methods as are otherwise conventional for forming patterned microelectronic conductor layers within microelectronic fabrications, such patterned microelectronic conductor layers when formed within microelectronic fabrications of copper containing conductor materials are often formed employing damascene methods, including but not limited to dual damascene methods.

As is understood by a person skilled in the art, within a damascene method a blanket copper containing conductor layer is formed into an aperture formed within a patterned microelectronic layer, where the aperture typically comprises a via and/or trench defined within a patterned microelectronic dielectric layer, and the excess of the blanket copper containing conductor layer above the aperture is planarized while employing a chemical mechanical polish (CMP) planarizing method to form within the aperture a chemical mechanical polish (CMP) planarized patterned copper containing microelectronic conductor layer, such as a chemical mechanical polish (CMP) planarized patterned copper containing microelectronic conductor stud layer and/or a chemical mechanical polish (CMP) planarized patterned copper containing microelectronic conductor interconnect layer within the corresponding via and/or the corresponding trench defined by the patterned microelectronic dielectric layer.

While such chemical mechanical polish (CMP) planarizing methods are thus useful for forming within microelectronic fabrications chemical mechanical polish (CMP) planarized patterned copper containing microelectronic conductor layers within microelectronic fabrications, such chemical mechanical polish (CMP) planarizing methods in turn are also not entirely without problems in the art of microelectronic fabrication for forming chemical mechanical polish (CMP) planarized patterned copper containing microelectronic conductor layers within vias and/or trenches defined by patterned microelectronic dielectric layers within microelectronic fabrications. In that regard, it is also known in the art of microelectronic fabrication that a patterned copper containing microelectronic conductor layer, when formed employing a chemical mechanical polish (CMP) planarizing method, is often formed while providing a copper containing chemical mechanical polish (CMP) residue layer upon at least a portion of the microelectronic fabrication adjoining the patterned copper containing microelectronic conductor layer. Similarly, when etching through a passivation dielectric layer subsequently formed upon the chemical mechanical polish (CMP) planarized patterned copper containing microelectronic conductor layer a via to reach the chemical mechanical polish (CMP) planarized patterned copper containing microelectronic conductor layer formed employing the chemical mechanical polish (CMP) planarizing method, there is also often formed a copper containing via etch residue layer upon at least the sidewalls of the via. Such copper containing chemical mechanical polish (CMP) residue layers and copper containing via etch residue layers are in turn undesirable in the art of microelectronic fabrication since they often compromise the functionality or reliability of a microelectronic fabrication within which they are formed.

It is thus towards the goal of forming within the art of microelectronic fabrication microelectronic fabrications having formed therein copper containing residue layer free microelectronic layers in the presence of copper containing conductor layers, such as but not limited to copper containing via etch residue layer free layers and copper containing chemical mechanical polish (CMP) residue layer free microelectronic layers in the presence of copper containing conductor layers, that the present invention is directed.

Various methods and materials have been disclosed in the art of microelectronic fabrication for forming microelectronic fabrications and microelectronic structures with desirable properties within the art of microelectronic fabrication.

For example, Ng et al., in "*Synthesis of Some Carbonyl Derivatives of BTA and Determination of Their Inhibitive Properties for Copper in 3% NaCl Solution,*" Corrosion Science and Protection Technology, Vol. 9(3), July 1997, pp. 201–04, discloses various nitrogen substituted benzotriazole (BTA) derivatives formed incident to reaction of benzotriazole (BTA) with various acid chlorides (i.e., C1–C4 n-alkyl acid chlorides, t-butyl acid chloride, p-tolyl acid chloride and glutaryl di-acid chloride). The various nitrogen substituted benzotriazole (BTA) derivatives typically exhibit improved corrosion protection for copper surfaces in comparison with the nitrogen unsubstituted benzotriazole (BTA) parent material from which they are derived.

In addition, Kadomura, in U.S. Pat. No. 5,281,304, discloses a method for forming within a microelectronic fabrication from a blanket copper containing conductor layer formed within the microelectronic fabrication a patterned copper containing conductor layer formed within the microelectronic fabrication, while avoiding oxidation of the patterned copper containing conductor layer when forming the patterned copper containing conductor layer from the blanket copper containing conductor layer within the microelectronic fabrication. The method employs: (1) converting the surface of the blanket copper containing conductor layer to an anti-oxidation copper containing material prior to forming the patterned copper containing conductor layer from the blanket copper containing conductor layer; and (2) de-converting the anti-oxidation copper containing material to copper after forming the patterned copper containing conductor layer from the blanket copper containing conductor layer.

Further, Brusic et al., in U.S. Pat. No. 5,316,5573, disclose a corrosion protecting material layer which may be employed for protecting from corrosion within a microelectronic fabrication a non-noble metal layer, such as a cobalt non-noble metal layer, as well as an aqueous solution which may be employed for forming the corrosion protecting material layer upon the non-noble metal layer. The corrosion protecting layer comprises a copper (I) composition with benzotriazole (BTA) which is deposited from the aqueous solution comprising copper (II) ions and benzotriazole (BTA).

Still further, Sasaki et al., in U.S. Pat. No. 5,770,095, disclose a chemical mechanical polish (CMP) planarizing method and a chemical mechanical polish (CMP) slurry composition for use when forming from a blanket conductor layer within a microelectronic fabrication a chemical mechanical polish (CMP) planarized patterned conductor layer within the microelectronic fabrication, where the chemical mechanical polish (CMP) planarized patterned conductor layer is formed with attenuated dishing within the chemical mechanical polish (CMP) planarized patterned conductor layer. The chemical mechanical polish (CMP) planarizing method and the chemical mechanical polish (CMP) slurry composition realize the foregoing objects by incorporating into the chemical mechanical polish (CMP) slurry composition employed within the chemical mechanical polish (CMP) planarizing method in addition to a chemical mechanical polish (CMP) etching agent a chemical mechanical polish (CMP) protective film forming agent, where when the blanket conductor layer is a blanket copper containing conductor layer the chemical mechanical polish (CMP) protective film forming agent may comprise benzotriazole (BTA) or a benzotriazole (BTA) derivative.

Yet still further, Ulrich et al., in U.S. Pat. No. 5,897,379, disclose a method for selectively removing from only edge portions of a substrate employed within a microelectronic fabrication portions of a blanket copper containing layer formed over the substrate employed within the microelectronic fabrication, while not oxidizing remaining portions of the blanket copper containing layer formed over non-edge portions of the substrate. The method employs a masking of selected central portions of the blanket copper containing layer formed over the substrate and a subsequent wet chemical etching of the unmasked portions of the blanket copper containing layer at the edge portions of the substrate.

Still yet further, Lee et al., in U.S. Pat. No. 5,865,900, disclose a method for removing from an integrated circuit microelectronic fabrication structure within an integrated circuit microelectronic fabrication a metal fluoropolymer residue layer. The method comprises a sequential multi-step method employing: (1) a chlorine containing plasma to first form from the metal fluoropolymer residue layer a chlorine containing plasma treated metal fluoropolymer residue layer, which is then removed from the microelectronic fabrication by stripping while employing; (2) an aqueous acid solution, followed by; (3) an organic solvent.

Finally, Graham, in U.S. Pat. No. 5,882,452, discloses a related pair of methods and materials for removing from within a microelectronic fabrication a conductor etch residue layer formed incident to reactive ion etch (RIE) etching a blanket conductor layer to form a patterned conductor layer within the microelectronic fabrication, while avoiding pitting of the patterned conductor layer within the microelectronic fabrication. The methods employ when stripping the conductor etch residue layer: (1) an aqueous ammonium fluoride solution preferably saturated with carbon dioxide; and/or (2) (a) an aqueous ammonium fluoride solution followed by, (b) an aqueous solution saturated with ozone.

Desirable in the art of microelectronic fabrication are additional methods and materials which may be employed for forming within microelectronic fabrications copper containing residue layer free microelectronic layers in the presence of copper containing conductor layers within microelectronic fabrications.

It is towards the foregoing object that the present invention is directed.

SUMMARY OF THE INVENTION

A first object of the present invention is to provide a method and material for forming a copper containing residue layer free microelectronic layer within a microelectronic fabrication.

A second object of the present invention is to provide a method and material in accord with the first object of the present invention, where the copper containing residue layer free microelectronic layer within the microelectronic fabrication is formed within the presence of a copper containing conductor layer within the microelectronic fabrication.

A third object of the present invention is to provide a method and material in accord with the first object of the present invention and second object of the present invention, which method is readily commercially implemented.

In accord with the objects of the present invention, there is provided by the present invention a cleaner composition for stripping a copper containing residue layer. The cleaner composition comprises a hydroxyl amine material, an ammonium fluoride material and a benzotriazole (BTA) material.

The cleaner composition of the present invention also contemplates a method for employing the cleaner composition of the present invention for stripping from a microelectronic fabrication a copper containing residue layer in the presence of a copper containing conductor layer.

The present invention provides a method and material for forming a copper containing residue layer free microelectronic layer in the presence of a copper containing conductor layer within a microelectronic fabrication. The present invention realizes the foregoing object by providing a cleaner composition which may be employed for stripping from a microelectronic fabrication a copper containing residue layer in the presence of a copper containing conductor, where the cleaner composition comprises a hydroxyl amine material, an ammonium fluoride material and a benzotriazole (BTA) material. The cleaner composition of the present invention contemplates a method through which the cleaner composition of the present invention may be employed for stripping a copper containing residue layer from a microelectronic layer within a microelectronic fabrication in the presence of a copper containing conductor layer within the microelectronic fabrication.

The method of the present invention is readily commercially implemented. The present invention employs methods and individual materials which although reasonably accessible and generally available within fields not necessarily related to the present invention may nonetheless be readily adapted to provide the present invention. Since it is thus a process control, materials selection and materials application which provides at least in part the present invention, rather than exclusively the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method and material for forming within a microelectronic fabrication a copper containing residue layer free microelectronic layer in the presence of a copper containing conductor layer within the microelectronic fabrication. The present invention realizes the foregoing object by providing a cleaner composition for stripping from a microelectronic fabrication a copper containing residue layer in the presence of a copper containing conductor layer. The cleaner composition comprises a hydroxyl amine material, an ammonium fluoride material and a benzotriazole (BTA) material. The cleaner composition of the present invention contemplates a method through which the cleaner composition of the present invention may be employed for stripping from a microelectronic layer within the microelectronic fabrication a copper containing residue layer in the presence of a copper containing conductor layer.

The method and cleaner composition of the present invention may be employed for stripping from within microelectronic fabrications copper containing residue layers including but not limited to copper containing via etch residue layers and copper containing chemical mechanical polish (CMP) residue layers. Similarly, although not necessarily most preferred within the context of the present invention, the cleaner composition of the present invention may also be employed for stripping copper containing direct etch residue layers from patterned copper containing conductor layers formed employing a direct reactive ion etch (RIE) plasma etch method within a microelectronic fabrication. Under such circumstances the microelectronic layer which is formed copper containing residue layer free in the presence of the copper containing conductor layer within the microelectronic fabrication is the patterned copper containing conductor layer formed employing the direct reactive ion etch (RIE) plasma etch method within the microelectronic fabrication. Finally, the method and cleaner composition of the present invention may be employed for stripping from within microelectronic fabrications copper containing residue layers within the presence of copper containing conductor layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
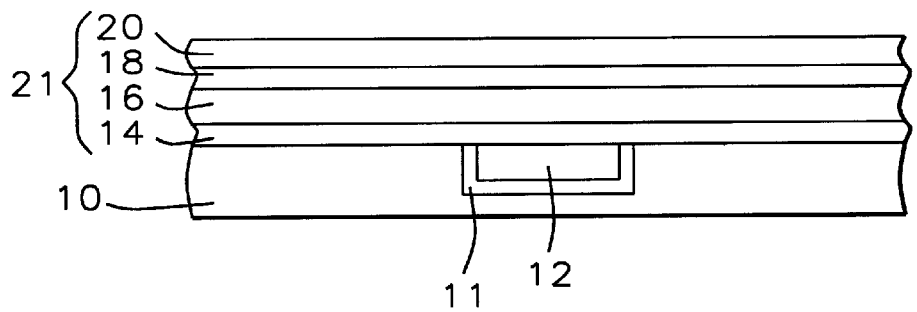
FIG. 1, FIG. 2, FIG. 3, FIG. 4, FIG. 5 and FIG. 6 show a series of schematic cross-sectional diagrams illustrating the results of progressive stages in forming within a microelectronic fabrication in accord with a preferred embodiment of the present invention a copper containing residue layer free microelectronic structure comprising a chemical mechanical polish (CMP) planarized patterned copper containing conductor layer formed within a copper containing residue layer free via through a microelectronic dielectric stack layer within the microelectronic fabrication.

Referring now to FIG. 1 to FIG. 6, there is shown a series of schematic cross-sectional diagrams illustrating the results of progressive stages in forming within a microelectronic fabrication in accord with a preferred embodiment of the present invention a copper containing residue layer free microelectronic structure comprising a chemical mechanical polish (CMP) planarized patterned copper containing conductor layer formed within a copper containing residue layer free via through a microelectronic dielectric stack layer within the microelectronic fabrication. Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed incorporated therein a patterned first barrier layer 11 having formed thereupon a patterned first copper containing conductor layer 12. In turn, there is also illustrated within the schematic cross-sectional diagram of FIG. 1 formed upon exposed portions of the substrate 10, the patterned first barrier layer 11 and the patterned first copper containing conductor layer 12 a blanket dielectric stack layer 21 comprising: (1) a blanket second barrier and passivation layer 14 formed upon exposed portions of the substrate 10, the patterned first barrier layer 11 and the patterned first copper containing conductor layer 12; (2) a blanket first dielectric layer 16 formed upon the blanket second barrier and passivation layer 14; (3) a blanket etch stop layer 18 formed upon the blanket first dielectric layer 16; and (4) a blanket second dielectric layer 20 formed upon the blanket etch stop layer 18. Each of the foregoing substrate 10, patterned layers and blanket layers may be formed employing methods and materials as are conventional in the art of microelectronic fabrication.

For example, within the preferred embodiment of the present invention with respect to the substrate 10, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may comprise the substrate alone as employed within the microelectronic fabrication, or in the alternative, the substrate 10 may comprise the substrate as employed within the microelectronic fabrication, where the substrate has formed thereupon and/or thereover, and thus incorporated therein, any of several additional microelectronic layers as are conventional within the microelectronic fabrication within which is employed the substrate. Similarly with the substrate alone as employed within the microelectronic fabrication, such additional microelectronic layers may independently be formed of microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly but not exclusively when the substrate 10 comprises a semiconductor substrate employed within a semiconductor integrated circuit microelectronic fabrication, typically and preferably has formed therein and/or thereupon microelectronic devices as are conventional within the microelectronic fabrication within which is employed the substrate 10. Such microelectronic devices may include, but are not limited to resistors, transistors, diodes and capacitors.

In addition, within the preferred embodiment of the present invention with respect to the patterned first barrier layer 11 and the blanket second barrier and passivation layer 14, each of the patterned first barrier layer 11 and the blanket second barrier and passivation layer 14 may be formed of barrier materials as are conventional in the art, of microelectronic fabrication, including but not limited to dielectric barrier materials and conductor barrier materials, for providing a barrier for interdiffusion of a copper containing conductor material from which is formed the patterned first copper containing conductor layer 12 with layers adjoining the patterned first copper containing conductor layer 12. Typically and preferably, the patterned first barrier layer 11 will be formed of a conductor barrier material such as but not limited to a titanium, titanium nitride, tantalum, tantalum nitride, tungsten or tungsten nitride conductor barrier material, or alternatively from another titanium, tantalum or tungsten compound material, formed conformally to a thickness of from about 50 to about 1000 angstroms, while in comparison, the blanket second barrier and passivation layer 14 will typically and preferably be formed of a dielectric barrier material, such as but not limited to a silicon nitride dielectric barrier material, formed conformally to a thickness of from about 50 to about 3000 angstroms.

Similarly, within the preferred embodiment of the present invention with respect to the patterned first copper containing conductor layer 12, the patterned first copper containing conductor layer 12 may be formed of copper containing conductor materials as are conventional in the art of microelectronic fabrication, including but not limited to copper and copper alloys of preferably greater than about 0.5 weight percent copper, more preferably from about 50 to about 100 weight percent copper. Typically and preferably, the patterned first copper containing conductor layer 12 is formed to a thickness of from about 500 to about 20000 angstroms and a linewidth of from about 0.05 to about 200 microns.

Further, within the preferred embodiment of the present invention with respect to the blanket first dielectric layer 16 and the blanket second dielectric layer 20, while each of the blanket first dielectric layer 16 and the blanket second dielectric layer 20 may be formed of dielectric materials as are conventional in the art of microelectronic fabrication, including but not limited to silicon oxide dielectric materials, silicon nitride dielectric materials, silicon oxynitride dielectric materials, spin-on-glass (SOG) low dielectric constant dielectric materials, spin-on-polymer (SOP) low dielectric constant dielectric materials and other low dielectric constant dielectric materials, each of the blanket first dielectric layer 16 and the blanket second dielectric layer 20 is preferably formed of a silicon oxide dielectric material or other dielectric material which in absence of the blanket second barrier and passivation layer 14 would interdiffuse with the copper containing conductor material from which is formed the patterned first copper containing conductor layer 12. For the preferred embodiment of the present invention the blanket first dielectric layer 16 is typically and preferably formed to a thickness of from about 1000 to about 20000 angstroms, while the blanket second dielectric layer 20 is also typically and preferably formed to a thickness of from about 1000 to about 20000 angstroms.

Finally, within the preferred embodiment of the present invention with respect to the blanket etch stop layer 18, although the blanket etch stop layer 18 may be formed from any of several etch stop material as are conventional in the art of microelectronic fabrication, including but not limited to conductor etch stop materials and dielectric etch stop materials, for processing efficiency the blanket etch stop layer 18 is typically and preferably formed of a dielectric etch stop material analogous or equivalent to the dielectric barrier material from which is formed the blanket second barrier and passivation layer 14. Typically and preferably, the blanket etch stop layer 18 is formed to a thickness of from about 50 to about 3000 angstroms.

Figure 2:
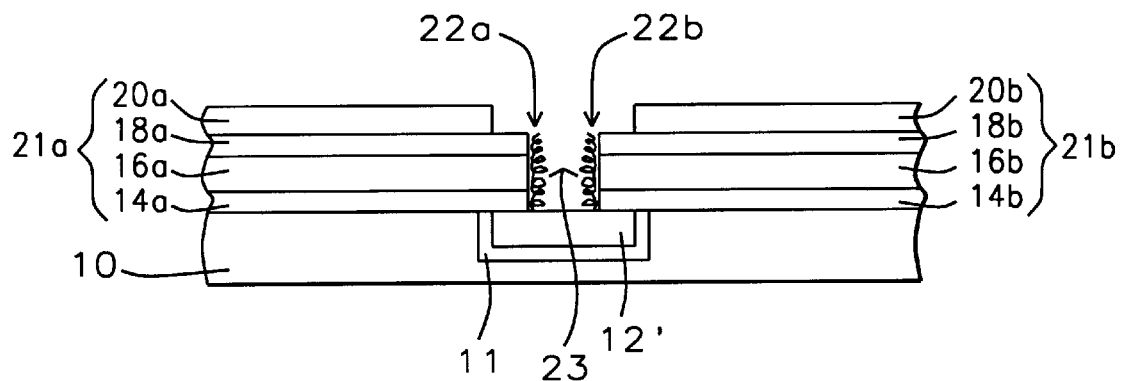

Referring now to FIG. 2, there is shown a schematic cross-sectional diagram illustrating the results of further processing of the microelectronic fabrication whose schematic cross-sectional diagram is illustrated in FIG. 1. Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed through the blanket dielectric stack layer 21 comprising the blanket second barrier and passivation layer 14, the blanket first dielectric layer 16, the blanket etch stop layer 18 and the blanket second dielectric layer 20 an aperture 23 which reaches the patterned first copper containing conductor layer 12, while simultaneously forming a pair of patterned dielectric stack layers 21a and 21b which comprise: (1) a corresponding pair of patterned second barrier and passivation layers 14a and 14b, having formed thereupon; (2) a corresponding pair of patterned first dielectric layers 16a and 16b, having formed thereupon; (3) a corresponding pair of patterned etch stop layers 18a and 18b; in turn having formed thereupon; (4) a corresponding pair of patterned second dielectric layers 20a and 20b, as well as: (1) a pair of first copper containing residue layers 22a and 22b upon a pair of sidewalls of the aperture 23; and (2) an etched patterned first copper containing conductor layer 12' formed from the patterned first copper containing conductor layer 12.

As is understood by a person skilled in the art, and as is illustrated within the schematic cross-sectional diagram of FIG. 1, the aperture 23 comprises: (1) a via defined by the pair of patterned second barrier and passivation layers 14a and 14b, the pair of patterned first dielectric layers 16a and 16b and the pair of patterned etch stop layers 18a and 18b, where there is contiguous with and completely overlapping the via, and of areal dimensions larger than the via; (2) a trench defined by the pair of patterned second dielectric layers 20a and 20b. Within the preferred embodiment of the present invention: (1) the via is preferably formed with a maximum aperture width of from about 0.05 to about 20 microns; and (2) the trench is preferably formed with a minimum aperture width of from about 0.05 to about 200 microns.

As is similarly also understood by a person skilled in the art, to form the aperture 23 as illustrated within the schematic cross-sectional diagram of FIG. 2 in the form of the via contiguous with the trench, there is typically and preferably employed a two step plasma etch method employing two separate plasma etch methods, one for forming the via and the other for forming the trench. The two plasma etch methods may be employed independently, forming either the via first, followed by the trench, or in the alternative the trench first, followed by the via. When employing the preferred materials as disclosed above for the series of blanket layers within the blanket dielectric stack layer 21, each of the two separate plasma etch methods will typically and preferably employ an etchant gas composition comprising at least one fluorine containing etchant gas selected from the group including but not limited to perfluorocarbons of up to about five carbon atoms, hydrofluorocarbons of up to about five carbon atoms, nitrogen trifluoride and sulfur hexafluoride. Thus, since the microelectronic fabrication whose schematic cross-sectional diagram is illustrated in FIG. 2 may be formed incident to multiple fabrication schemes which are independent of the present invention, there is omitted within the present description additional details of any particular fabrication scheme.

Within the preferred embodiment of the present invention with respect to the pair of first copper containing residue layers 22a and 22b, the pair of first copper containing residue layers 22a and 22b is typically comprised of: (1) copper containing conductor material derived from etching the patterned first copper containing conductor layer 12 when forming the etched patterned first copper containing conductor layer 12'; (2) etch residues from the materials from which are formed the blanket layers within the blanket dielectric stack layer 21 in conjunction with the etchants employed within the plasma etch methods employed for forming the aperture 23; and (3) possible photoresist etch mask layer residues.

Figure 3:
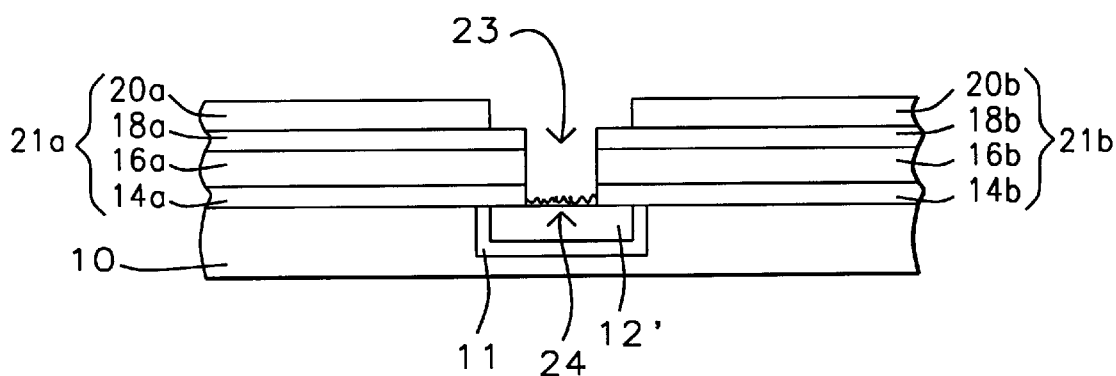

Referring now to FIG. 3, there is shown a schematic cross-sectional diagram illustrating the results of further processing of the microelectronic fabrication whose schematic cross-sectional diagram is illustrated in FIG. 2. Shown in FIG. 3 is a schematic cross-sectional diagram of a microelectronic fabrication otherwise equivalent to the microelectronic fabrication whose schematic cross-sectional diagram is illustrated in FIG. 2, but wherein: (1) there has been stripped from the sidewalls of the aperture 23 the pair of first copper containing residue layers 22a and 22b; and (2) there is formed upon the etched patterned first copper containing conductor layer 12' a first passivation layer 24.

Within the preferred embodiment of the present invention, both: (1) the pair of first copper containing residue layers 22a and 22b is stripped from the sidewalls of the aperture 23 within the microelectronic fabrication whose schematic cross-sectional diagram is illustrated in FIG. 2 to provide in part the microelectronic fabrication whose schematic cross-sectional diagram is illustrated in FIG. 3; and (2) the first passivation layer 24 is formed upon the etched patterned first copper containing conductor layer 12' as illustrated within the microelectronic fabrication schematic cross-sectional diagram of FIG. 2 to also provide in part the microelectronic fabrication whose schematic cross-sectional diagram of FIG. 3, while employing a cleaner composition in accord with the present invention.

In accord with the present invention, the cleaner composition comprises: (1) a hydroxyl amine material; (2) an ammonium fluoride material; and (3) a benzotriazole (BTA) material. Also in accord with the present invention, the cleaner composition may be either an aqueous based cleaner composition or an organic solvent based cleaner composition.

Within the present invention and the preferred embodiment of the present invention with respect to the hydroxyl amine material, the hydroxyl amine material may be selected from the group including but not limited to hydroxyl amine, ethanol amine, other alkanol amines, alkoxy amines and any other hydroxyl or amine substituted hydroxyl amines and their salts preferably employed at a concentration of from about 1E-4 to about 80 weight percent within the cleaner composition of the present invention, more preferably employed at a concentration of from about 0.1 to about 50 weight percent within the cleaner composition of the present invention.

Similarly, within the present invention and the preferred embodiment of the present invention with respect to the ammonium fluoride material, the ammonium fluoride material may be selected from the group including but not limited to ammonium fluoride and alkyl ammonium fluorides, preferably employed at a concentration of from about 1E-4 to about 80 weight percent within the cleaner composition of the present invention, more preferably at a concentration of from about 0.1 to about 50 weight percent within the cleaner composition of the present invention.

Finally, within the present invention and the preferred embodiment of the present invention with respect to the benzotriazole (BTA) material, the benzotriazole (BTA) material may be selected from the group including but not limited to benzotriazole (BTA), tolyl triazole (TTA) and other substituted benzotriazoles (BTAs) (such as but not limited to the substituted benzotriazoles (BTAs) as disclosed within Ng et al, as cited within the Description of the Related Art, preferably employed at a concentration of from about 1E-4 to about 50 weight percent within the cleaner composition of the present invention, more preferably employed at a concentration of from about 0.01 to about 20 weight percent within the cleaner composition of the present invention.

Figure 7:
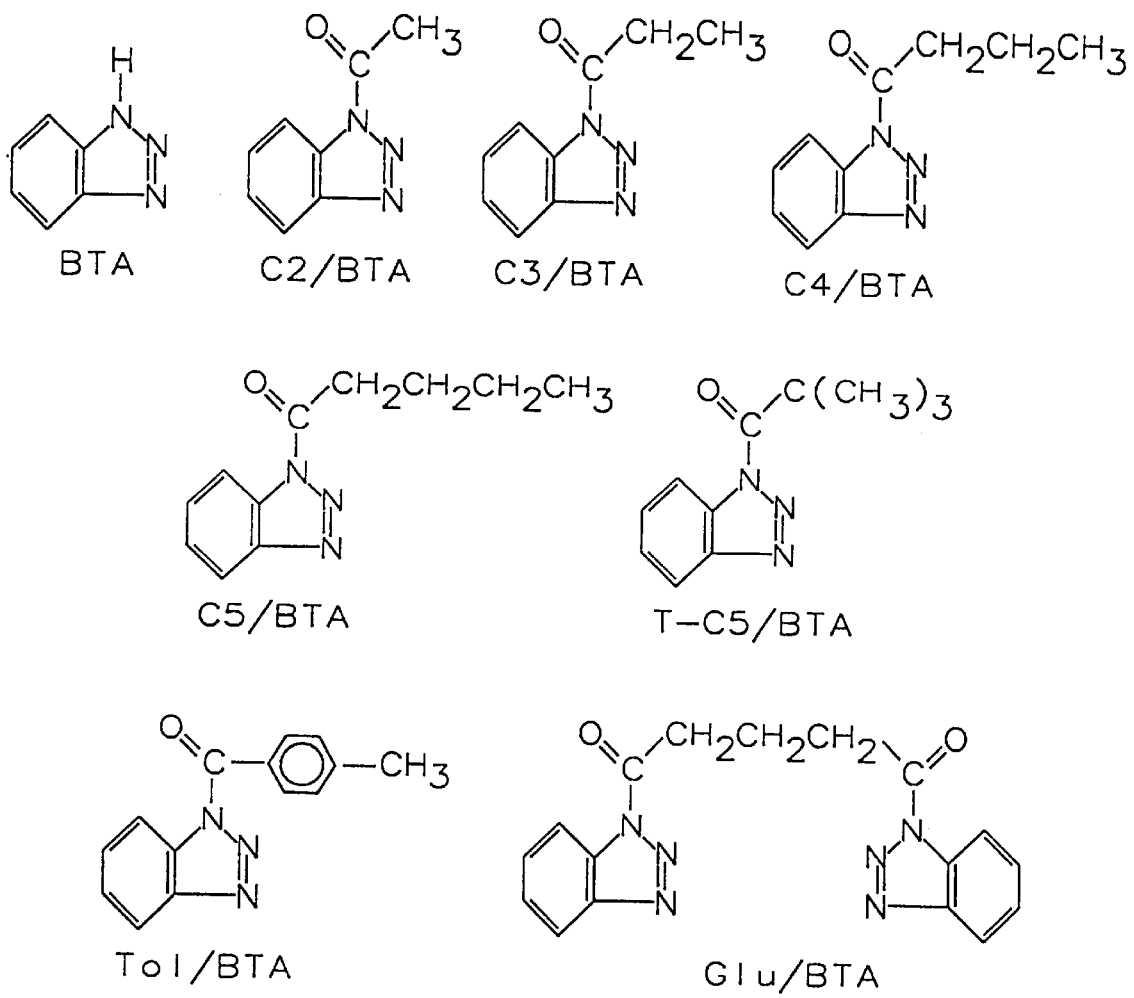
FIG. 7 illustrates BTA and the BTA derivatives disclosed in Ng. et al.

Most preferably, the cleaner composition of the present invention comprises a solution of hydroxyl amine or other nitrogen substituted hydroxyl amine at a concentration of from about 0.1 to about 50 weight percent, ammonium fluoride at a concentration of from about 0.1 to about 50 weight percent and benzotriazole (BTA) or a benzotriazole (BTA) derivative as disclosed within Ng et al., as cited within the Description of the Related Art, all of which related art is incorporated herein by reference, at a concentration of from about 0.01 to about 20 weight percent. Please see FIG. 7 illustrating BTA and the BTA derivatives disclosed in Ng et al.

The cleaner composition of the present invention may optionally also comprise other salts for purposes of increasing ionic strength and for purposes of pH adjustment (i.e., buffering agents). Such other salts may include but are not limited to: (1) fluoride salts of amine compounds, hydroxyl amine compounds and substituted amine compounds, as well as; (2) carboxylate salts of ammonium compounds and amine compounds, such as but not limited to hydroxyl amine compounds and other substituted amine compounds. Such other salts may be added to the cleaner composition of the present invention at a concentration of from about 1E-4 to about 50 weight percent (preferably from about 1E-1 to about 50 weight percent).

For the cleaner composition of the present invention, all of the components may be either dissolved in water or in at least one polar organic solvent to form either an aqueous cleaner composition of an organic solvent cleaner composition. Organic solvents which may be employed when formulating the cleaner composition of the present invention include, but are not limited to, methanol, ethanol, other alkanols, alkanones, alkanals, alkanoic acids, esters, ethers, amines and combinations thereof. Similarly, one of the components of the cleaner composition of the present invention (i.e., the hydroxyl amine or hydroxyl amine material) may also serve as an organic solvent.

Typically and preferably, the cleaner composition of the present invention is employed at a temperature of from about 10 to about 90 degrees centigrade for a treatment time period of from about 0.1 to about 30 minutes, for stripping from within the aperture 23 within the microelectronic fabrication whose schematic cross-sectional diagram is illustrated in FIG. 2 the pair of first copper containing residue layers 22a and 22b and for also forming upon the etched patterned first copper containing conductor layer 12' the first passivation layer 24, which in the aggregate form from the microelectronic fabrication whose schematic cross-sectional diagram is illustrated in FIG. 2 the microelectronic fabrication whose schematic cross-sectional diagram is illustrated in FIG. 3. Within the preferred embodiment of the present invention, the cleaner composition of the present invention strips the pair of first copper containing residue layers 22a and 22b from within the aperture 23 while not substantially further etching (i.e. no greater than about 300 angstroms removal) the etched patterned first copper containing conductor layer 12' at the bottom of the aperture 23.

Within the preferred embodiment of the present invention, it is believed that the first passivation layer 24 is formed primarily of a thin layer of a benzotriazole (BTA) material which typically does not add substantially (i.e. no greater than about 20 percent increase) to a contact resistance of the etched patterned first copper containing conductor layer 12'. Optionally, within the present invention, the first passivation layer 24 may be removed from the etched patterned first copper containing conductor layer 12' while employing a "soft" (i.e., comparatively low power) sputter etch or reactive etch method step.

Within the present invention and the preferred embodiment of the present invention, the microelectronic fabrication whose schematic cross-sectional diagram is illustrated in FIG. 2 may be treated with the cleaner composition of the present invention to provide the microelectronic fabrication whose schematic cross-sectional diagram is illustrated in FIG. 3 while employing treatment methods including but not limited to immersion treatment methods and spray treatments methods, along with optional activation methods including but not limited to ultrasonic activation methods and megasonic activation methods, as well as brush scrubbing methods.

Figure 4:
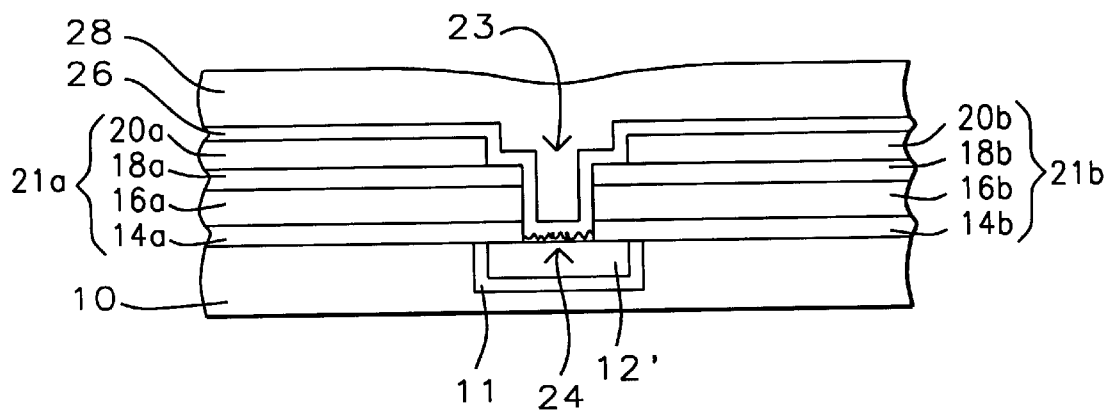

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) there is formed conformally upon the microelectronic fabrication and including exposed portions of the patterned layers within the pair of patterned dielectric stack layers 21a and 21b a blanket third barrier layer 26 which does not completely fill the aperture 23; and (2) there is formed upon the blanket third barrier layer 26 a blanket second copper containing conductor layer 28 which does completely fill the aperture 23.

Within the preferred embodiment of the present invention with respect to the blanket third barrier layer 26, the blanket third barrier layer 26 is generally optional within the present invention but preferably included within the preferred embodiment of the present invention. The blanket third barrier layer 26 is typically and preferably formed of a conductor barrier material analogous or equivalent to the conductor barrier material from which is formed the patterned first barrier layer 11. Typically and preferably, the blanket third barrier layer 26 is formed conformally to a thickness of from about 50 to about 1000 angstroms upon exposed portions of the patterned layers within the pair of patterned dielectric stack layers 21a and 21b, as well as exposed portions of the etched patterned first copper containing conductor layer 12' having the first passivation layer 24 formed thereupon, while not completely filling the aperture 23.

Similarly, within the preferred embodiment of the present invention with respect to the blanket second copper containing conductor layer 28, the blanket second copper containing conductor layer 28 may be formed of copper containing conductor materials as are employed for forming the patterned first copper containing conductor layer 12 as illustrated within the schematic cross-sectional diagram of FIG. 1. Typically and preferably, the blanket second copper containing conductor layer 28 is formed to a thickness of from about 1000 to about 30000 angstroms upon the blanket third barrier layer 26, while completely filling the aperture 23.

Figure 5:
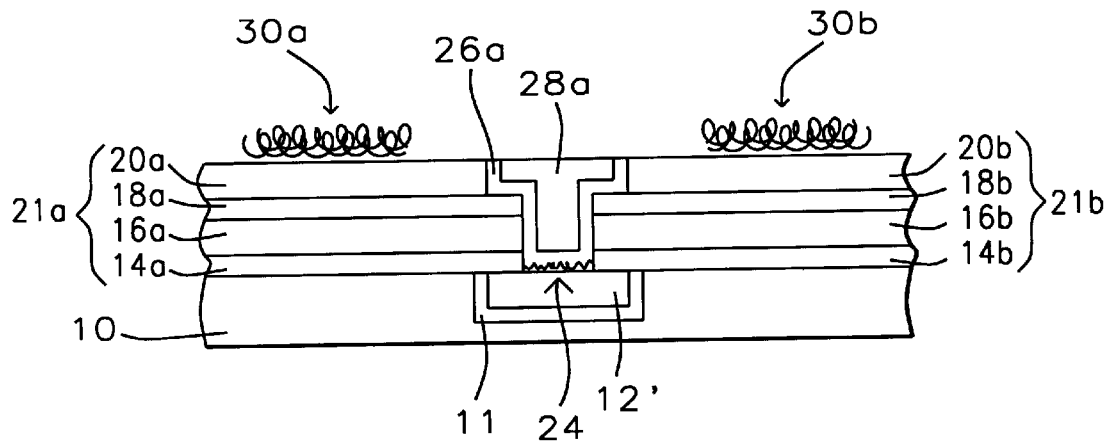

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the blanket second copper containing conductor layer 28 and the blanket third barrier layer 26 have been chemical mechanical polish (CMP) planarized to form a corresponding chemical mechanical polish (CMP) planarized patterned second copper containing conductor layer 28a formed upon a corresponding patterned third barrier layer 26a within the aperture 23, while simultaneously forming a pair of second copper containing residue layers 30a and 30b upon the corresponding pair of patterned second dielectric layers 20a and 20b.

Within the preferred embodiment of the present invention with respect to the chemical mechanical polish (CMP) planarizing method which is employed for forming from the blanket second copper containing conductor layer 28 and the blanket third barrier layer 26 the corresponding chemical mechanical polish (CMP) planarized patterned second copper containing conductor layer 28a and the corresponding patterned third barrier layer 26a, the chemical mechanical polish (CMP) planarizing method typically and preferably employs an aqueous slurry composition comprising a silica or alumina abrasive, along with a potassium permanganate, potassium iodate, cerium oxide or hydrogen peroxide oxidizing agent. Typically and preferably, when chemical mechanical polish (CMP) planarizing the blanket second copper containing conductor layer 28 and the blanket third barrier layer 26 to form the corresponding chemical mechanical polish (CMP) planarized patterned second copper containing conductor layer 28a and the corresponding patterned third barrier layer 26a within the aperture 23, the chemical mechanical polish (CMP) planarizing method also employs: (1) a platen pressure of from about 0.5 to about 10 pounds per square inch (psi); (2) a wafer linear velocity of from about 10 to about 2000 feet per minute (fpm); (3) a substrate 10 temperature of from about 5 to about 95 degrees centigrade; and (4) a slurry feed rate of about 10 to about 500 cubic centimeters per minute (ccm).

Within the preferred embodiment of the present invention with respect to the pair of second copper containing residue layers 30a and 30b, the pair of second copper containing residue layers 30a and 30b typically and preferably comprises: (1) residual copper containing conductor material derived from the copper containing conductor material from which is formed the blanket second copper containing conductor layer 28, along with; (2) residual barrier material derived from the barrier material from which is formed the blanket third barrier layer 26, along with; (3) residual slurry material from the slurry composition which is employed within the chemical mechanical polish (CMP) planarizing method for forming from the blanket second copper containing conductor layer 28 and the blanket third barrier layer 26 the corresponding chemical mechanical polish (CMP) planarized patterned second copper containing conductor layer 28a and the corresponding patterned third barrier layer 26a.

Figure 6:
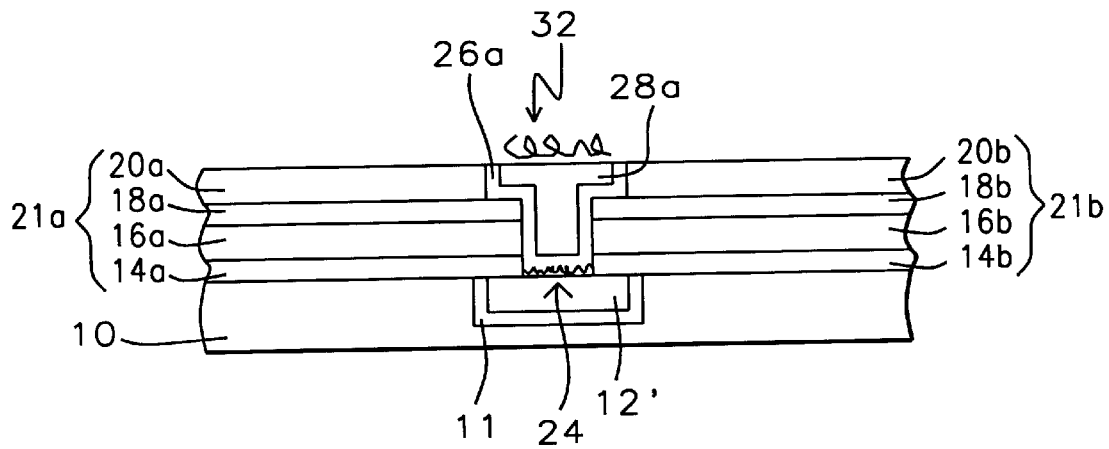

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein: (1) there has been stripped from the pair of patterned second dielectric layers 20a and 20b the pair of second copper containing residue layers 30a and 30b; while (2) there has been simultaneously formed upon the chemical mechanical polish (CMP) planarized patterned second copper containing conductor layer 28a a second passivation layer 32.

Within the preferred embodiment of the present invention: (1) the pair of second copper containing residue layers 30a and 30b is stripped from the pair of patterned second dielectric layers 20a and 20b within the microelectronic fabrication as illustrated within the schematic cross-sectional diagram of FIG. 5 to provide in part the microelectronic fabrication whose schematic cross-sectional diagram is illustrated in FIG. 6; and (2) the second passivation layer 34 is formed upon the chemical mechanical polish (CMP) planarized patterned second copper containing conductor layer 28a as illustrated within the microelectronic fabrication whose schematic cross-sectional diagram of FIG. 5 to also provide in part the microelectronic fabrication whose schematic cross-sectional diagram is illustrated in FIG. 6, while employing the same cleaner composition as is employed for forming from the microelectronic fabrication whose schematic cross-sectional diagram is illustrated in FIG. 2 the microelectronic fabrication whose schematic cross-sectional diagram is illustrated in FIG. 3.

Similarly, although the first copper containing residue layers 22a and 22b as illustrated within the microelectronic fabrication whose schematic cross-sectional diagram is illustrated within FIG. 2 and the second copper containing residue layers 30a and 30b as illustrated within the microelectronic fabrication whose schematic cross-sectional diagram is illustrated in FIG. 5 are formed of typically nominally different chemical compositions, both pair of copper containing residue layers may be stripped employing the same cleaner composition in accord with the present invention, while employing analogous or equivalent conditions of treatment time, temperature and extrinsic activation.

Upon forming the microelectronic fabrication whose schematic cross-sectional diagram is illustrated in FIG. 6, there is formed a microelectronic fabrication having formed therein a copper containing residue layer free chemical mechanical polish (CMP) planarized patterned copper containing conductor layer within a copper containing residue layer free aperture. The copper containing residue layer free chemical mechanical polish (CMP) planarized patterned copper containing conductor layer and the residue free aperture are formed employing a cleaner composition comprising: (1) a hydroxyl amine material; (2) an ammonium fluoride material; and (3) a benzotriazole (BTA) material.

As is understood by a person skilled in the art, the preferred embodiment of the present invention is illustrative of the present invention rather than limiting of the present invention. Revisions and modifications may be made to methods, materials, structures and dimensions through which is provided the preferred embodiment of the present invention while still providing embodiments which are within the spirit and scope of the present invention, in accord with the appended claims.

What is claimed is:

1. A cleaner composition for stripping a copper containing residue layer on a microelectronic structure comprising:
   a hydroxyl amine material;
   an ammonium fluoride material; and
   a benzotriazole material; the benzotriazole material selected from the group consisting of C2/BTA, C3/BTA, C4/BTA, C5/BTA, T-C5/BTA, Tol/BTA and Glu/BTA.

2. The cleaner composition of claim 1 wherein the cleaner composition is selected from the group consisting of an aqueous cleaner composition and an organic solvent cleaner composition.

3. The cleaner composition of claim 1 wherein:
   the hydroxyl amine material is selected from the group consisting of hydroxyl amine, ethanol amine, other alkanol amines, alkoxy amines and any other hydroxyl or amine substituted hydroxyl amines and their salts; and
   the hydroxyl amine material is present at a concentration of from about 1E-4 to about 80 weight percent.

4. The cleaner composition of claim 1 wherein:
   the ammonium fluoride material is selected from the group consisting of ammonium fluoride and alkyl ammonium fluorides; and
   the ammonium fluoride material is present at a concentration of from about 1E-4 to about 80 weight percent.

5. The cleaner composition of claim 1, wherein the benzotriazole material is selected from the group consisting of C2/BTA, C3/BTA, C4/BTA, T-C5/BTA, Tol/BTA and Glu/BTA.

6. The cleaner composition of claim 1, wherein the benzotriazole material is selected from the group consisting of C2/BTA, C3/BTA, C4/BTA, T-C5/BTA and Glu/BTA.

7. The cleaner composition of claim 1, wherein the benzotriazole material is C2/BTA.

8. The cleaner composition of claim 1, wherein the benzotriazole material is C3/BTA.

9. The cleaner composition of claim 1, wherein the benzotriazole material is C4/BTA.

10. The cleaner composition of claim 1, wherein the benzotriazole material is TC5/BTA.

11. The cleaner composition of claim 1, wherein the benzotriazole material is Glu/BTA.

12. The cleaner composition of claim 1, wherein the benzotriazole material is selected from the group consisting of C2/BTA, C3/BTA, C4/BTA, T-C5/BTA and Glu/BTA; and the ammonium fluoride material is present at a concentration of from about 0.01 to 50 weight percent.

13. The cleaner composition of claim 1, wherein the benzotriazole material is selected from the group consisting of C2/BTA, C3/BTA, C4/BTA, T-C5/BTA and Glu/BTA; and the benzotriazole material is present at a concentration of from about 0.01 to 20 weight percent.

14. The cleaner composition of claim 1, wherein the benzotriazole material is selected from the group consisting of C2/BTA, C3/BTA, C4/BTA, T-C5/BTA and Glu/BTA; and the hydroxyl amine material is present at a concentration of from about 0.1 to 50 weight percent.

15. A cleaner composition for stripping a copper containing residue layer on a microelectronic structure comprising:
- a hydroxyl amine material at a concentration of from about 1E-4 to 80 weight percent;
- an ammonium fluoride material at a concentration of from about 1E-4 to 80 weight percent; and
- a benzotriazole material at a concentration of from about 1E-4 to 50 weight percent; the benzotriazole material selected from the group consisting of C2/BTA, C3/BTA, C4/BTA, T-C5/BTA, Tol/BTA and Glu/BTA.

16. The cleaner composition of claim 15, wherein the benzotriazole material is selected from the group consisting of C2/BTA, C3/BTA, C4/BTA, T-C5/BTA and Glu/BTA.

17. The cleaner composition of claim 15, wherein the benzotriazole material is C2/BTA.

18. The cleaner composition of claim 15, wherein the benzotriazole material is C3/BTA.

19. The cleaner composition of claim 15, wherein the benzotriazole material is C4/BTA.

20. The cleaner composition of claim 15, wherein the benzotriazole material is T-C5/BTA.

21. The cleaner composition of claim 15, wherein the benzotriazole material is Glu/BTA.

22. The cleaner composition of claim 15, wherein the benzotriazole material is selected from the group consisting of C2/BTA, C3/BTA, C4/BTA, T-C5/BTA and Glu/BTA; and the ammonium fluoride material is present at a concentration of from about 0.01 to 50 weight percent.

23. The cleaner composition of claim 15, wherein the benzotriazole material is selected from the group consisting of C2/BTA, C3/BTA, C4/BTA, T-C5/BTA and Glu/BTA; and the benzotriazole material is present at a concentration of from about 0.01 to 20 weight percent.

24. The cleaner composition of claim 15, wherein the benzotriazole material is selected from the group consisting of C2/BTA, C3/BTA, C4/BTA, T-C5/BTA and Glu/BTA; and the hydroxyl amine material is present at a concentration of from about 0.1 to 50 weight percent.

* * * * *